United States Patent [19]

Schmidt et al.

[11] Patent Number: 5,655,839

[45] Date of Patent: Aug. 12, 1997

[54] IR TEMPERATURE SENSOR

[75] Inventors: Volker Schmidt; Gerald Burkert, both of Berlin, Germany

[73] Assignee: Raytek Sensorik GmbH, Berlin, Germany

[21] Appl. No.: 479,125

[22] Filed: Jun. 7, 1995

[30] Foreign Application Priority Data

Jun. 16, 1994 [DE] Germany .................. 44 21 065.5

[51] Int. Cl.⁶ .................. G01K 1/08; G01J 5/04; G01J 5/06
[52] U.S. Cl. .................. 374/132; 374/130; 250/338.1
[58] Field of Search .................. 374/132, 130; 250/338.1

[56] References Cited

U.S. PATENT DOCUMENTS

| | | | |
|---|---|---|---|
| 2,561,077 | 7/1951 | Tilton | 374/130 |
| 2,811,856 | 11/1957 | Harrison | 374/132 |
| 4,120,200 | 10/1978 | Braun | 374/132 |
| 4,722,612 | 2/1988 | Junkert et al. | 374/133 |
| 4,986,672 | 1/1991 | Beynon | 374/130 |
| 5,172,978 | 12/1992 | Nomura et al. | 374/130 |
| 5,323,005 | 6/1994 | Merkel | 374/132 |

FOREIGN PATENT DOCUMENTS

| | | | |
|---|---|---|---|
| 0277529 | 12/1987 | Japan | 374/130 |
| 0218481 | 5/1968 | U.S.S.R. | 374/130 |
| 0570794 | 8/1977 | U.S.S.R. | 374/130 |
| 0744914 | 2/1956 | United Kingdom | 374/130 |

Primary Examiner—Diego F. F. Gutierrez
Attorney, Agent, or Firm—Learman & McCulloch

[57] ABSTRACT

An IR temperature sensor comprises a sealed housing containing an inert gas atmosphere and enclosing a detector for conversion of heat radiation into an electrical signal, an optical system which images the heat radiation emanating from an object onto the detector, a heat-conducting temperature equalization element which maintains the detector and the optical system at a common temperature, and a temperature sensor which measures the temperature of the temperature equalization element. The sealed housing protects the sensor from the external environment and maintains uniform temperature between the optical system and the sensor.

7 Claims, 1 Drawing Sheet

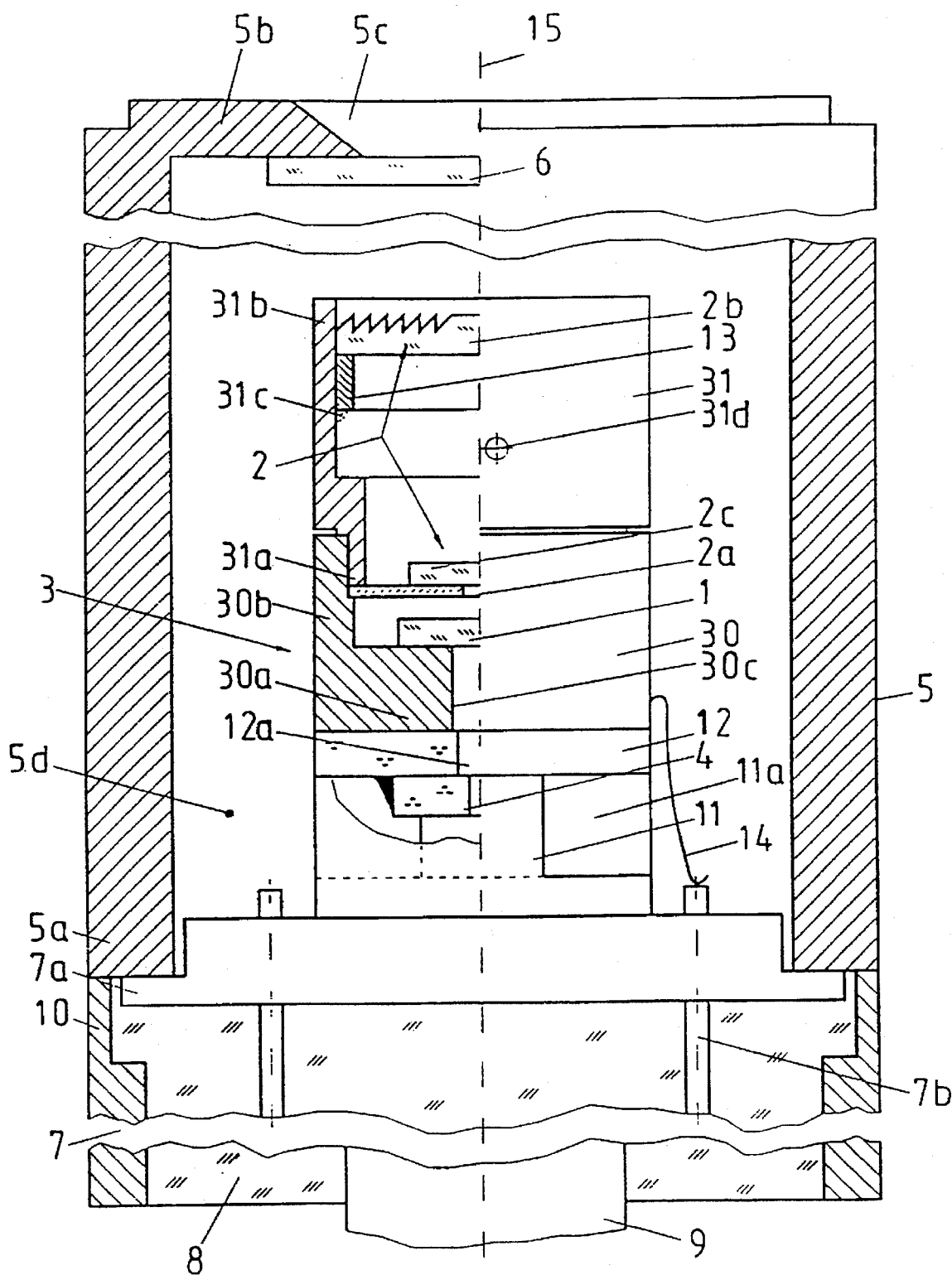

IR TEMPERATURE SENSOR

The invention relates to a device for sensing temperature.

BACKGROUND OF THE INVENTION

Such devices which are known in the art comprise a detector for conversion of heat radiation into an electrical signal, an optical system which images the heat radiation emanating from an object of measurement onto the detector, a heat-conducting temperature equalization element which keeps the detector and the optical system at a common temperature, a temperature sensor which measures the temperature of the temperature equalization element, as well as a housing which encloses all the components.

A detector which is very frequently used is the so-called thermopile. This consists of a row of pairs of thermoelements disposed in a circle, the hot solder joints forming an inner circle and the cold solder joints forming an outer circle. The inner circle with the hot solder joints is typically located on a thin film, whilst the outer circle with the cold solder joints is connected to the temperature equalization element. The hot solder joints are blackened in order to increase the degree of absorption. The heat radiation (IR radiation) striking the hot solder joints from the optical system heats the hot solder joints to a temperature different from the cold solder joints. Due to the Seebeck effect a voltage is produced from which the temperature of the object of measurement can be determined.

In order to protect the thermopile from environmental influences and in particular to keep the time constant and the sensitivity of the thermopile independent of the composition of the air and humidity, the thermopile is hermetically enclosed. The detector housing typically consists of a metal transistor housing with an IR window. It is filled with a defined gas, usually an inert gas such as argon or neon. However, these devices, which are also known by the term pyrometers, have the disadvantage that when measurements are carried out below 0° C. and at high air humidity moisture can penetrate into the device. In the optical system bedewing with water or freezing out of ice can occur, rendering temperature measurement impossible, since water and ice are impermeable to IR rays.

The object of the invention, therefore, is to make further developments so that temperature measurements are also reliably possible below 0° C.

SUMMARY OF THE INVENTION

This object is achieved by the characterising features, in which the housing enclosing the detector, the optical system, the heat-conducting equalization element and the temperature sensor is filled with a gas, preferably a buffer gas, and is closed off towards the exterior so as to by gas-tight. In this way moisture can be reliably prevented from penetrating into the interior of the housing.

In a preferred embodiment the actual detector housing is omitted and the casing for the detector is formed by the temperature equalization element. In this way, the detector can be positioned substantially more accurately with respect to the optical system because the tolerance of the positioning of the detector in the detector housing, which is typically ±0.1 mm, is not applicable. This tolerance is especially disruptive particularly when optical systems with short focal lengths are used, since here tolerances in the positioning have substantially greater effects than in optical systems having a greater focal length.

THE DRAWINGS

Further advantages and embodiments of the invention are explained in greater detail by the following description of an embodiment and the sole drawing FIGURE which is a fragmentary view of the device partly in elevation and partly in section.

DETAILED DESCRIPTION

The device for temperature sensing which is illustrated in the drawings essentially comprises a detector 1 for conversion of heat radiation into an electrical signal, an optical system 2 which images the heat radiation emanating from an object of measurement onto the detector 1, a heat-conducting temperature equalization element 3 which keeps the detector 1 and the optical system 2 at a common temperature, a temperature sensor 4 which measures the temperature of the temperature equalization element, as well as a housing 5 which encloses all the components.

This housing 5 is constructed so that it is open towards the bottom and includes a cylindrical side wall 5a and a flanged edge 5b which extends inwards on the upper face and leaves a central circular opening 5c free. This opening 5c is covered on the inside by a so-called infrared glass 6 or for example also by a silicon disc.

The housing 5 is closed off on its underside by a base 7 which includes a metal base plate 7a and contact pints 7b which are disposed thereon in an insulated manner and extend from the exterior through the base plate and into the interior of the housing 5. A synthetic resin block 8 in which the contact pins 7b are brought together into a central connecting cable 9 adjoins the outside of the base plate 7a. The synthetic resin block 8 is delimited laterally by a sleeve 10 which corresponds in diameter to that of the cylindrical side wall 5a of the housing 5.

The base 7 is preferably welded to the cylindrical side wall of the housing 5, whilst the infrared glass 6 is adhered to the flanged edge 5b in a suitable manner, so that the resulting inner chamber 5d of the housing 5 is closed off towards the exterior so as to be gas-tight.

In the inner chamber 5d of the housing the detector 1, the optical system 2, the temperature equalization element 3 and the temperature sensor 4 are disposed so that they are heat-insulated with respect to the housing. For this purpose, first of all, a spacer block 11 made from plastics material is provided on the base plate 7a. In the illustrated embodiment the spacer block 11 has a square outline and is provided on the side opposite the base plate 7a with a diagonally extending recess 11a, the depth of the recess amounting to approximately three quarters of the height of the spacer block 11.

A ceramic plate 12 with a hybrid circuit is disposed on the spacer block 11.

The ceramic plate has a central bore 12a which opens on the underside in the recess 11a of the spacer block 11. The temperature sensor 4 mounted on the underside of the ceramic plate 12 also has a bore for pressure equalization. This temperature sensor is constructed for example as a PTC resistor in the manner of SMD construction.

The heat-conductive temperature equalization element 3, which comprises a cooper dish 30 and a sleeve 31 pushed thereon, is disposed on the upper face of the ceramic plate 12. The copper dish 30 is substantially in the form of a cup with a base 30a and cylindrical side wall 30b. The thickness of the base in ratio to the diameter is approximately 1:4, whilst the side wall is approximately half as thick as the base. Furthermore a bore 30c, which is aligned with the bore 12a in the ceramic plate, is provided in the base.

The detector 1 which is constructed as a thermosensor chip is disposed on the base 30a and covers the bore 30c.

The internal diameter of the side wall 30b in the region of the base up to half of the height of the side wall is somewhat smaller than the internal diameter of the region located above it. As a result, at approximately half-way up the side wall 30b a shoulder is formed on which an aperture diaphragm 2a rests.

For fixing of the aperture diaphragm the sleeve 31 with is flange 31a is pushed into the copper dish 30 until it rests on the aperture diaphragm. For fixing of the copper dish 30 and sleeve 31, both parts are advantageously soldered to one another or connected to one another in some other way.

The cylindrical side wall 31b of the sleeve 31 has in the interior, approximately half-way up, a shoulder 31c which serves as a bearing surface for a retaining ring 13 which supports a lens 2b of the optical system 2. The lens 2b is preferably constructed as a Fresnel lens.

An IR filter 2c, which fixes the desired wavelength range, is provided in the path of the rays before the aperture diaphragm 2a and in direct contact with the latter.

The hybrid circuit located on the ceramic plate 12 is electrically connected both to the detector 1 and to the temperature sensor 4. The corresponding output signals are passed on by the hybrid circuit by way of bonding wires 14 to the contact pins 7b.

In the inner chamber 5d of the housing is located a gas, preferably a dry buffer gas, such as for example nitrogen. The gas also passes into the interior of the temperature equalization element 3, in which on the one hand the side wall 30b of the copper dish merely extends over an angular range of approximately 270° and the sleeve 31b is provided with a bore 31d in the side wall 31b.

These bores and opening are also necessary for pressure equalization between the space above and below the detector 1, so that the thin silicon oxide film of the detector 1, on which the thermoelements are mounted, does not tear during fluctuations of pressure.

The opening 5c of the housing, the optical system 2, the detector 1, the temperature equalization element 3 and the temperature sensor 4 are advantageously disposed symmetrically about a central axis 15.

During the temperature measurement the radiation emanating from an object of measurement passes through the opening 5c and the infrared glass 6 first of all into the inner chamber of the housing 5. The radiation is focused by the lens 2b, delimited in its wavelength range by the IR filter 2c and applied to the detector 1 by way of the aperture diaphragm 2a. The voltage resulting from the thermoelements is led to the exterior by way of the hybrid circuit and the contact pins. Simultaneously the temperature sensor 4 measures the temperature of the temperature equalization element 3, the output signals form which are also transmitted to the exterior.

The heat-conducting temperature equalization element 3 should on the one hand keep the detector 1 and the optical system at a common temperature, since the properties of both components are greatly dependent upon temperature. On the other hand the temperature equalization element 3 has the function of increasing the thermal time constant of the components which are heat-insulted from the housing 5.

The use of a dry buffer gas prevents the penetration of moisture into the interior of the housing 5. In this way it is possible to use this device also in measurements around 0° C. without the optical system being influenced by bedewing with water or freezing out of ice.

The use of a buffer gas also has the further advantage that hygroscopic materials such as for example sodium chloride, potassium bromide and barium fluoride can be used for the lens 2b. This facilitates particularly economical production of the device according to the Invention which, moreover, can be used in a wide temperature range and has good optical properties.

Since the detector 1 does not have its own additional housing as in conventional devices for temperature measurement, but its housing is formed by the temperature equalization element 3, the device according to the invention can be of substantially smaller construction. As a result it is possible for the pyrometer head illustrated in the drawing to be produced with external dimensions of approximately 15–20 mm.

Furthermore, the detector 1 can be positioned substantially more accurately with respect to the leans 2b, since the tolerance of the positioning of the detector in the conventional detector housing, which is typically ±0.1 mm, is not applicable.

We claim:

1. An IR temperature sensing device comprising:
    a detector for converting heat radiation into an electrical signal;
    an optical system for imaging heat radiation emanating from an object onto said detector;
    a heat-conducting temperature equalization member operative to maintain said detector and said optical system at a common temperature;
    a temperature sensor communicating with said equalization member for sensing the temperature of said equalization member; and
    a housing having a gas-tight sealed chamber containing an inert gas atmosphere accommodating and communicating with each of said detector, said optical system, said equalization member, and said temperature sensor.

2. The device of claim 1 wherein said detector, said optical system, said equalization member, and said temperature sensor are heat-insulated from said housing.

3. The device of claim 1 wherein said detector is accommodated within said equalization member in open communication with said sealed chamber of said housing.

4. The device of claim 1 wherein said optical system includes at least one lens fabricated of hygroscopic material.

5. The device of claim 1 wherein said optical system comprises a Fresnel lens, and IR filter, and an aperture diaphragm.

6. The device of claim 1 wherein said equalization member includes a cup-shaped dish having a base and a cylindrical side wall.

7. The device of claim 6 wherein said sensor is mounted on said base and said optical system is supported by said side wall.

* * * * *